(12) United States Patent
Onvlee et al.

(10) Patent No.: US 12,032,301 B2
(45) Date of Patent: *Jul. 9, 2024

(54) SUBSTRATE SUPPORT, LITHOGRAPHIC APPARATUS AND LOADING METHOD

(71) Applicant: ASML NETHERLANDS B.V., Veldhoven (NL)

(72) Inventors: Johannes Onvlee, 's-Hertogenbosch (NL); Antonius Franciscus Johannes De Groot, Someren (NL); Wim Symens, Leuven (BE); David Ferdinand Vles, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 18/090,873

(22) Filed: Dec. 29, 2022

(65) Prior Publication Data

US 2023/0134837 A1 May 4, 2023

Related U.S. Application Data

(63) Continuation of application No. 16/092,021, filed as application No. PCT/EP2017/056644 on Mar. 21, 2017, now Pat. No. 11,556,063.

(30) Foreign Application Priority Data

Apr. 20, 2016 (EP) ..................................... 16166176

(51) Int. Cl.
*G03F 7/00* (2006.01)

(52) U.S. Cl.
CPC ...... *G03F 7/70708* (2013.01); *G03F 7/70691* (2013.01); *G03F 7/707* (2013.01); *G03F 7/70733* (2013.01)

(58) Field of Classification Search
CPC .. G03F 7/70691; G03F 7/707; G03F 7/70708; G03F 7/70733; B65B 11/52;
(Continued)

(56) References Cited

U.S. PATENT DOCUMENTS 5,325,261 A 6/1994 Horwitz
5,831,181 A 11/1998 Majumdar
(Continued)

FOREIGN PATENT DOCUMENTS

JP H06-204107 7/1994
JP H06-244270 9/1994
(Continued)

OTHER PUBLICATIONS

International Search Report and Written Opinion issued in corresponding PCT Patent Application No. PCT/EP2017/056644, dated Jul. 14, 2017.
(Continued)

*Primary Examiner* — Deoram Persaud
(74) *Attorney, Agent, or Firm* — Pillsbury Winthrop Shaw Pittman, LLP

(57) ABSTRACT

A substrate support for supporting a substrate. The substrate support includes a main body, a clamping device and a dither device. The main body includes a support surface for supporting the substrate. The clamping device is arranged to provide the clamping force to clamp the substrate on the support surface. The dither device is configured to dither the clamping force. The dither device may be configured to dither the clamping force while the substrate is being loaded onto the support surface.

20 Claims, 4 Drawing Sheets

(58) Field of Classification Search
CPC ......... B65B 35/52; B65B 47/02; B65B 47/04; B65B 57/04; B65B 61/06; B65B 65/02; B65G 57/302; B65G 57/305; B65H 2301/42122

See application file for complete search history.

(56) References Cited

U.S. PATENT DOCUMENTS

| | | | |
|---|---|---|---|
| 6,002,987 | A | 12/1999 | Kamiya |
| 6,522,519 | B1 | 2/2003 | Hirayanagi |
| 2001/0002871 | A1 | 6/2001 | Nagao et al. |
| 2003/0067734 | A1 | 4/2003 | Nakano |
| 2007/0008512 | A1 | 1/2007 | Van Der Schoot |
| 2008/0316461 | A1 | 12/2008 | Compen |
| 2009/0059199 | A1 | 3/2009 | Kuit et al. |
| 2009/0086187 | A1* | 4/2009 | Compen ............... G03F 7/707 355/73 |
| 2009/0195763 | A1 | 8/2009 | Butler et al. |
| 2010/0195080 | A1 | 8/2010 | Compen et al. |
| 2012/0212725 | A1 | 8/2012 | Lafarre et al. |
| 2013/0031768 | A1 | 2/2013 | Kuit et al. |
| 2013/0033691 | A1 | 2/2013 | Soethoudt |
| 2013/0146785 | A1 | 6/2013 | Lafarre et al. |
| 2015/0009602 | A1 | 1/2015 | Adachi |
| 2015/0277240 | A1 | 10/2015 | Sinharoy et al. |
| 2016/0325946 | A1 | 11/2016 | Stopper |
| 2017/0192359 | A1* | 7/2017 | Leenders ............ H01L 21/6838 |
| 2017/0277041 | A1 | 9/2017 | Okwudire |
| 2019/0113853 | A1* | 4/2019 | Onvlee ............... G03F 7/70708 |

FOREIGN PATENT DOCUMENTS

| | | |
|---|---|---|
| JP | H07-263526 | 10/1995 |
| JP | H09246362 | 9/1997 |
| JP | H1167883 | 3/1999 |
| JP | H11-160599 | 6/1999 |
| JP | 2003-115442 | 4/2003 |
| JP | 2009152597 | 7/2009 |
| JP | 2010-527805 | 8/2010 |
| JP | 2010-530636 | 9/2010 |
| JP | 2010-531541 | 9/2010 |
| JP | 2010531541 | 9/2010 |
| JP | 2012-518900 | 8/2012 |
| JP | 2012-227554 | 11/2012 |
| JP | 2013-506268 | 2/2013 |
| JP | 2013-118366 | 6/2013 |
| JP | 2014138004 | 7/2014 |
| JP | 2014-225669 | 12/2014 |
| WO | 2008-156366 | 12/2008 |

OTHER PUBLICATIONS

Japanese Office Action issued in corresponding Japanese Patent Application No. 2018-555244, dated Mar. 24, 2020.
Machine translation of JP 2014138004 A.
Japanese Office Action issued in corresponding Japanese Patent Application No. 2020-134533, dated Jun. 15, 2021.

* cited by examiner

SUBSTRATE SUPPORT, LITHOGRAPHIC APPARATUS AND LOADING METHOD

This is a continuation of U.S. patent application Ser. No. 16/092,021, filed Oct. 8, 2018, which is the U.S. national phase entry of PCT patent application no. PCT/EP2017/056644, which was filed on Mar. 21, 2017, which claims the benefit of priority of European patent application no. 16166176.4, filed on Apr. 20, 2016, each of the foregoing application is incorporated herein in its entirety by reference.

FIELD

The present description relates to a substrate support, a lithographic apparatus and a loading method.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning direction") while synchronously scanning the substrate parallel or anti-parallel to this direction. It is also possible to transfer the pattern from the patterning device to the substrate by imprinting the pattern onto the substrate.

In a known embodiment of a lithographic apparatus, a substrate is loaded on a support surface of a substrate support by a robot which holds the substrate at the bottom side of the substrate. To make loading of the substrate on a substantially horizontal support surface possible, three loading pins, also called e-pins, are provided in the substrate table. The loading pins are movable between an extended position, in which the upper ends of the loading pins extend above the substrate table, and a retracted position, in which the upper ends of the loading pins are retracted in the substrate table.

During the loading of the substrate on the substrate table, the robot loads the substrate on the three loading pins in the extended position. Since the substrate will be received on the loading pins extending above the support surface, the robot can be withdrawn leaving the substrate on the loading pins.

Then, the loading pins can be moved to the retracted position to place the substrate on the support surface. The support surface is defined by upper ends of the multiple burls provided on, and extending from, a main body of the substrate table.

The shape of the substrate during the loading sequence is defined by, among other things, the gravity sag of the substrate when supported on the loading pins and the shape of the substrate itself, which may be warped, for example due to preceding processing steps. There is limited freedom to manipulate the final substrate shape, once it is loaded on the support surface.

As a result, during the loading, different portions of the substrate will usually touch the burls of the support surface at different moments. In the time period between the substrate first touching one or more burls and the substrate being completely supported by the burls, the shape of the substrate changes from an initial shape, caused by the substrate being supported by only three loading pins in gravity, to a final shape when supported by the multiple burls. Typically, during this time period, portions of the substrate, in particular its outer edge, should slide over the burls in order for the substrate to be arranged in an optimal flattened shape on the support surface.

Further, when the substrate is at least partially supported on the support surface, the substrate may be clamped on the support surface, for example by a vacuum clamp or an electrostatic clamp. The vacuum force or electrostatic force will flatten a non-flat, warped substrate on the support surface and pull it down on the burls. This pulling down of the substrate on the support surface also should result in sliding of the substrate over the burls of the support surface to enable the substrate to be substantially arranged in the optimal flattened shape on the support surface.

To facilitate sliding of the substrate over the burls, it would be beneficial to make the friction of the burls can be made as low possible. However, this would result in relatively easy sliding of the substrate over the substrate support during the projection of the patterned beams on the substrate, in particular since the substrate support and the substrate supported thereon are subject to high accelerations and decelerations during the projection process. Therefore, it is undesirable that the friction of the substrate support, in particular the burls is lowered to facilitate sliding of the substrate over the burls.

When loading of the substrate on the support surface, defined by the upper ends of the burls, does not result in sliding of the substrate over the burls, for example caused by a large friction between the substrate and the burls, there may be internal stresses/forces in the substrate when it is held by the support. These internal stresses are undesirable, since these internal stresses may have an influence on the position and/or shape of the substrate during the projection a patterned beam on the substrate. Since this position and/or shape may be different in different projections on the same substrate, the internal stresses may adversely affect the overlay performance of the lithographic apparatus.

SUMMARY

It is desirable to provide a substrate support which provides improved positioning of a substrate on a substrate support in order to reduce overlay errors caused by substrate load grid deformation. Further, it is desirable to provide a substrate support that enables loading and/or unloading of a substrate on the support surface which results in less wear of the support surface and/or the substrate.

According to an embodiment of the invention, there is provided a substrate support for supporting a substrate, comprising: a body; a clamping device; and a dither device, wherein the body comprises a support surface for supporting the substrate, wherein the clamping device is arranged to provide a clamping force to clamp the substrate on the support surface, and wherein the dither device is configured to dither the clamping force.

According to an embodiment of the invention, there is provided a lithographic apparatus comprising: the substrate support as described herein; an illumination system configured to condition a radiation beam; a support constructed to support a patterning device, the patterning device being capable of imparting the radiation beam with a pattern in its cross-section to form a patterned radiation beam; and a projection system configured to project the patterned radiation beam onto a target portion of the substrate.

According to an embodiment of the invention, there is provided a loading method, comprising: transferring a substrate from a handling device onto a support surface, providing a clamping force to clamp the substrate on the support surface, dithering the clamping force while partly supporting the substrate with the handling device and partly supporting the substrate with the support surface.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
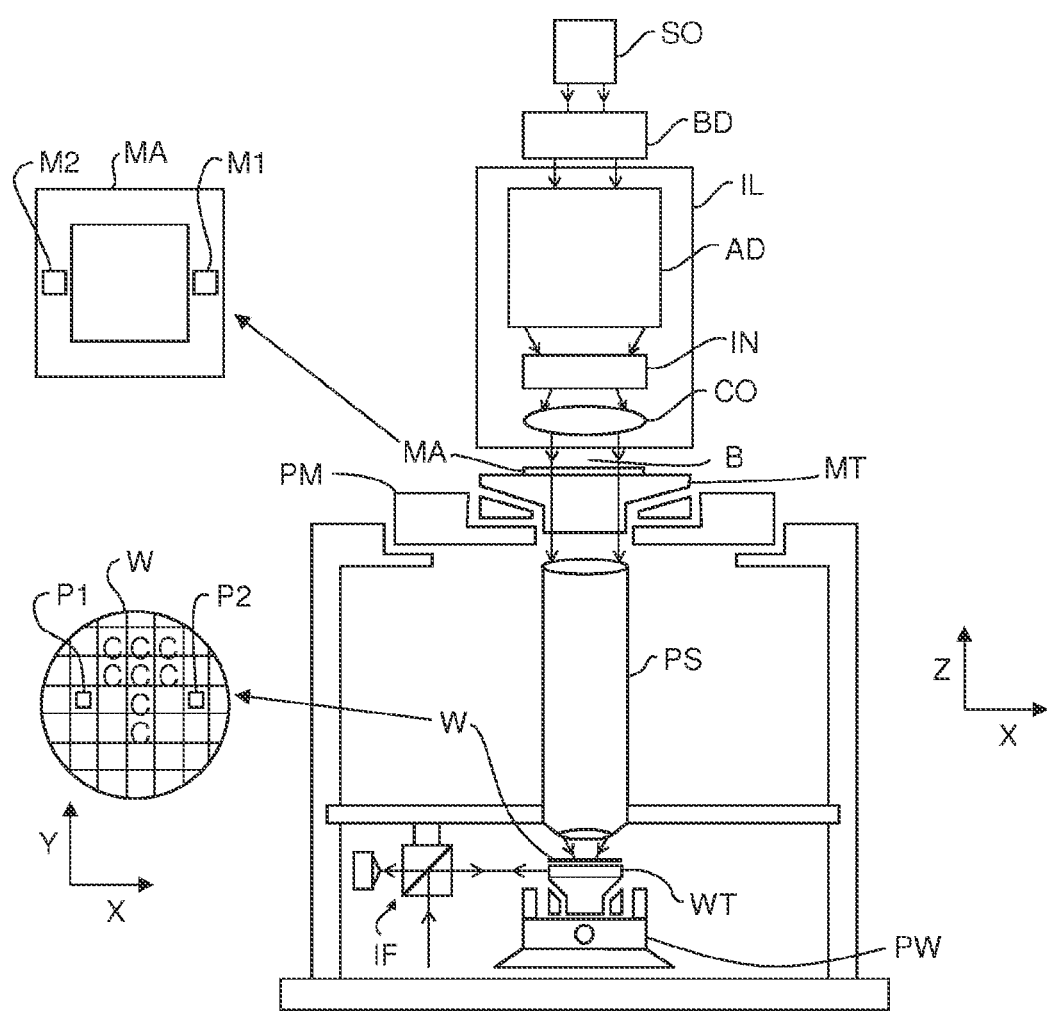
FIG. 1 depicts schematically a lithographic apparatus comprising a substrate stage according to an embodiment of the invention

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate support (e.g. a wafer table) WT or "substrate table" constructed to hold a substrate (e.g. a resist-coated wafer) W and connected to a second positioning device PW configured to accurately position the substrate in accordance with certain parameters. The apparatus further includes a projection system (e.g.—a refractive projection lens system) PS configured to project a pattern imparted to the radiation beam B by patterning device MA onto a target portion C (e.g. including one or more dies) of the substrate W.

The illumination system IL may include various types of optical components, such as refractive, reflective, magnetic electromagnetic, electrostatic or other types of optical components, or any combination thereof, for directing, shaping, or controlling radiation.

The mask support structure MT supports, i.e. bears the weight of, the patterning device MA. It holds the patterning device MA in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate W. It should be noted that the pattern imparted to the radiation beam may not exactly corresponds to the desired pattern in the target portion of the substrate, for example if the pattern includes phase-shifting features or so-called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure. In addition to one or more substrate supports, the lithographic apparatus may have a measurement stage provided with at least one sensor to measure a property of the substrate support or a property of the radiation beam exiting the projection system. The measurement stage may be arranged not to hold a substrate.

The lithographic apparatus may also be of a type wherein at least a portion of the substrate W may be covered by a liquid having a relatively high refractive index, e^. water, so as to fill a space between the projection system PS and the substrate W. An immersion liquid may also be applied to other spaces in the lithographic apparatus, for example, between the patterning device MA and the projection system PS, Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the radiation source SO is not considered to form part of the lithographic apparatus and the radiation beam is passed from the radiation source SO to the illuminator IL with the aid of a beam delivery system BD including, for example, suitable directing mirrors and/or a beam expander. In other cases the radiation source SO may be an integral part of the lithographic apparatus, for example when the radiation source SO is a mercury lamp. The radiation source SO and the illuminator IL, together with the beam delivery system BO if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device MA, which is held on the mask support structure MT, and is patterned by the patterning device MA. Having traversed the patterning device MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate support WT can be moved accurately, e.g. so as to position different target portions C in the path of the radiation beam B. Similarly, the first positioning device PM and another position sensor (which is not explicitly depicted in FIG. 1) can be used to accurately position the patterning device MA with respect to the path of the radiation beam B, e.g. after mechanical retrieval from a mask library, or during a scan. In general, movement of the mask support structure MT may be realized with the aid of a long-stroke module (coarse positioning) and a short-stroke module (fine positioning), which form part of the first positioning device PM. Similarly, movement of the substrate support WT may be realized using a long-stroke module and a short-stroke module, which form part of the second positioner PW. In the case of a stepper (as opposed to a scanner) the mask support structure MT may be connected to a short-stroke actuator only, or may be fixed. Patterning device MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the mask alignment marks may be located between the dies.

The depicted apparatus could be used in at least one of the following modes:

1. In step mode, the mask support structure MT and the substrate support WT are kept essentially stationary, while an entire pattern imparted to the radiation beam is projected onto a target portion C at one time (i.e. a single static exposure). The substrate support WT is then shifted in the X and/or Y direction so that a different target portion C can be exposed. In step mode, the maximum size of the exposure field limits the size of the target portion C imaged in a single static exposure.

2. In scan mode, the mask support structure MT and the substrate support WT or "substrate table" are scanned synchronously while a pattern imparted to the radiation beam is projected onto a target portion C (i.e. a single dynamic exposure). The velocity and direction of the substrate support WT or "substrate table" relative to the mask support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask support structure MT is kept essentially stationary holding a programmable patterning device, and the substrate support WT or "substrate table" is moved or scanned while a pattern imparted to the radiation beam is projected onto a target portion C. In this mode, generally a pulsed radiation source is employed and the programmable patterning device is updated as required after each movement of the substrate support WT or in between successive radiation pulses during a scan. This mode of operation can be readily applied to maskless lithography that utilizes programmable patterning device, such as a programmable mirror array of a type as referred to above.

Combinations and/or variations on the above-described modes of use or entirely different modes of use may also be employed.

The lithographic apparatus comprises a substrate support WT. An upper part of the substrate support WT is shown in more detail in FIG. 2 in cross-section.

The substrate support WT comprises a main body MB and a plurality of burls B extending from the main body MB to a supporting height to define a support surface S. The support surface S is configured to support the substrate W on the substrate support WT. During manufacture of the substrate support WT, the burls B are machined and polished with high precision to obtain a flat horizontal support surface S. The burls B limit the surface area of contact between the substrate support WT and the substrate W so as to prevent contamination on the substrate support WT or on the bottom of the substrate W to affect the substrate W when the substrate W is supported on the support surface S.

Further, a vacuum space VS between the burls B is delimited by a sealing ring SR. This vacuum space VS may be used to create an underpressure to clamp the substrate W on the support surface S, in particular on the upper ends of the burls B. The vacuum space VS between the burls B and limited by the sealing ring SR is thereto connected via vacuum conduits VC to a vacuum source VSO.

To load or unload the substrate W on/from the substrate support WT, the substrate support WT is provided with a set of loading pins LP configured to receive and support the substrate W.

Figure 2:
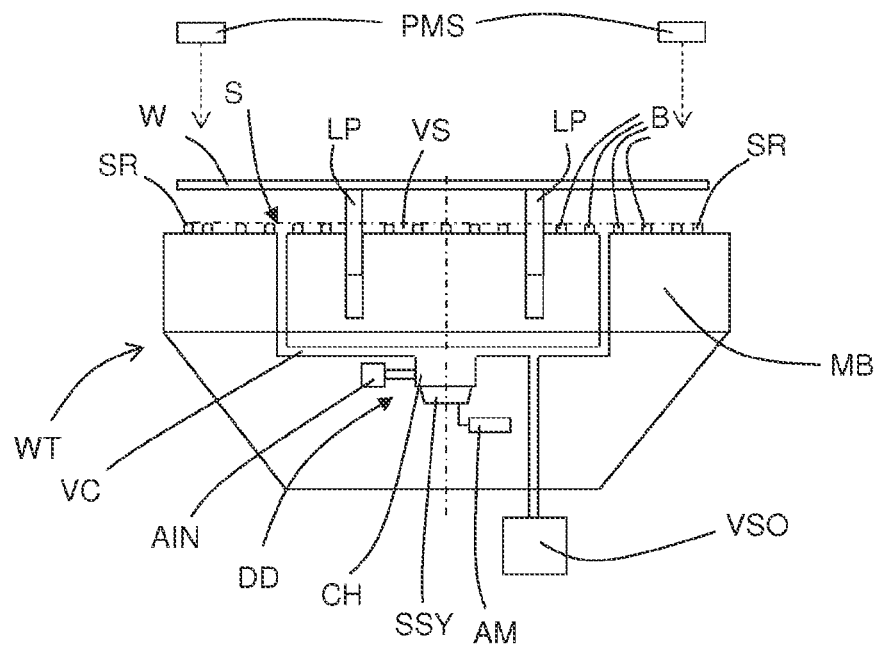
FIG. 2 shows a first embodiment of a substrate support according to an embodiment of the invention.

In the example shown, the set of loading pins LP comprises three pins (only two shown) extending substantially vertically. Each loading pin LP is movable between a retracted position and an extended position. In the retracted position, an upper end of the loading pin LP is arranged below the support surface S. In the extended position, the upper end of the loading pin LP extends above the support surface S. In FIG. 2 the loading pins LP are shown in the extended position and the substrate W is supported by the loading pins LP. The substrate W is for instance loaded on the loading pins LP by a loading device, such as a loading robot.

When loading the substrate W on the support surface S, the loading pins LP are lowered into the main body MB of the substrate support WT so that the substrate W comes to rest on the burls B. The substrate W is usually not perfectly flat. For example, preceding process steps may result in the substrate W being warped. Furthermore, due to gravity, the shape of the substrate W may be influenced when the substrate W is supported on the loading pins LP.

As a result of the non-flatness of the substrate W, the substrate W will not be flat when the substrate W is lowered onto the support surface S and the substrate W may have to slide over the burls B in order to adapt a flattened shape on the support surface S. In order to clamp the substrate W on the support surface S, the vacuum clamp system will exert a clamping force on the substrate W by creating an underpressure in the vacuum space VS. This clamping may result in further flattening, and as a consequence sliding, of the substrate W on the support surface S. The vacuum clamp system may comprise the vacuum space VS, the sealing ring SR and the vacuum conduit VC.

The vacuum clamp system is an example of a clamping device arranged to provide the clamping force to clamp the substrate W on the support surface S. The dither device DD is configured to dither the clamping force. The clamping force may comprise a vacuum force provided by the vacuum clamp system. The dither device DD may be arranged to dither the vacuum force.

To avoid internal stresses in the substrate W supported and clamped on the support surface S, and to improve overlay performance, it is desirable that the friction between the top ends of the burls B and the substrate W is low such that the substrate W can easily slide over burls B when the substrate W is flattened during loading, and in particular clamping of the substrate W on the support surface S.

At the same time it is desirable that during the actual lithographic process, i.e. during projecting a patterned beam of radiation onto a target portion C of the substrate W, there is high friction between the lop ends of the burls B and the substrate W to avoid that the substrate W shifts with respect to the support surface S during accelerations and/or decelerations of the substrate support WT.

Thus, during loading a low friction between the burls B and the substrate W is desirable, while during the actual lithographic process a high friction between the burls B and the substrate W is desirable.

In the substrate support WT shown in FIG. 2, the friction of the burls B is selected such that the friction obtained is sufficient to ensure that the substrate W is held in a fixed position with respect to the substrate W during the actual lithographic process, in particular during accelerations and/or decelerations of the substrate support WT.

Further, a dither device DD is provided configured to vibrate the substrate W during loading and/or unloading of the substrate W on the support surface S in order to reduce a friction between the support surface S and the substrate W. This reduced friction facilitates sliding of the substrate W over the burls B during this loading and/or unloading.

The dither device DD of the embodiment of FIG. 2 is configured to apply pressure waves on the substrate W to vibrate the substrate W. These pressure waves are created by a speaker system SSY arranged in the vacuum conduits VC of the vacuum clamping system.

The speaker system SSY is mounted in a chamber CH and connected to an amplifier AM that provides a signal to the speaker system SSY to emit pressure waves into the vacuum conduits VC. The pressure waves will propagate to the vacuum space VS where the pressure waves will have a vibrating effect on the substrate W. At least some gas, such as air, is in the vacuum conduits VC to propagate the pressure waves.

This vibrating effect will reduce the friction between the burls B and the substrate W. As a result, the substrate W will more easily slide over the burls B and internal stresses in the substrate W are avoided or at least substantially reduced and the substrate W will more easily move to the desired flattened position. As a result, the overlay performance of the lithographic process can be improved, i.e. less substrate deformation during loading of the substrate W on the substrate support WT results in better overlay performance.

It is remarked that reducing the friction between the burls B and the substrate W has a further advantageous effect in that wear of the burls B and/or substrate W due to the sliding of the substrate W over the burls B can be substantially reduced.

Further, it is remarked that since the vacuum conduits VC are used to create an underpressure in the vacuum space VS to exert a clamping force, i.e., a vacuum force, on the substrate W, the lower pressure in the vacuum conduits VC and the vacuum space VS will negatively influence the propagation of the pressure waves. It may be desirable to provide an air injection system AIN that supplies air into the vacuum clamping system, in particular into the chamber CH in front of the speaker system SSY to improve the propagation of the pressure waves through the vacuum conduits VC and the vacuum space VS.

Further, the speaker system SSY is preferably arranged close to the vacuum space VS so that the pressure waves quickly reach the vacuum space VS. The speaker system SSY may comprise multiple speakers arranged at different locations to effectively vibrate the substrate W supported on the support surfaces.

The pressure waves emitted by the speaker system SSY may have any suitable excitation frequency, for example between 1 kHz and 1 MHz.

The excitation frequency and an excitation amplitude of the pressure waves are selected to effectively reduce the friction between the burls B and the substrate W. It should be avoided that the substrate W is completely released from the support surface W due to the vibrations caused by the pressure waves. Also, the excitation frequency and excitation amplitude of the pressure waves should selected such that the substrate W, as a whole, is not substantially displaced over the support surface S to an undesirable position for the lithographic process.

Preferably, the excitation frequency and excitation amplitude of the pressure waves are selected such that the substrate W will remain in contact with all respective burls B, but it may also be possible that the substrate W is temporarily released from a few of the burls B due to the vibrations.

The vacuum conduit VC is configured to convey a flow from the support surface S to the vacuum source VSO. The flow may be a flow of ambient air or any other type of gas that surrounds the support surface S. The dither device DD may be arranged to alter a cross-section of the vacuum conduit VC. By altering the cross-section, the flow is disturbed. The disturbance of the flow causes a change in pressure in the vacuum conduit VC As a result, the pressure in the vacuum space VS changes. The changed pressure in the vacuum space VS causes a change in the vacuum force. So by altering the cross-section, the dither device DD can dither the vacuum force. The dither device DD may comprise a valve connected to the vacuum conduit VC The valve may have a piezo element to control a cross-section of the valve.

It is remarked that a position measurement system PMS may be provided to measure a position of the substrate W on the support surface S. Such position measurement system PMS, which for example may be capable of determining the position of the substrate W with respect to the support surface S by reading markers on the substrate W, may be used to check that the substrate W, as a whole, is not substantially displaced over the support surface S to an undesirable position for the lithographic process.

To optimally use the friction reducing effect of vibration of the substrate W during loading of the substrate W on the support surface S, the dither device DD may be configured to vibrate the substrate W during a period in which the vacuum clamping system is configured to increase the clamping force from zero to a maximum clamping force. The dither device DD may also be effectively used in the period that the substrate W is placed on the support surface S by lowering of the loading pins LP to the retracted position. This period may, in practice, at least partially overlap with the period in which the clamping force is increased from zero to the maximum clamping force.

When a substrate W is unloaded from the substrate support WT, the dither device DD may also effectively be used to reduce friction between the substrate W and the burls B. For example, during a period in which the vacuum clamping system is configured to decrease the clamping force from the maximum clamping force to zero, the dither device DD may vibrate the substrate W to reduce the friction between the burls B and the substrate W. The dither device DD may also effectively be used when the substrate W is lifted by the loading pins LP from the support surface S. During unloading reducing the friction between the burls B and the substrate W may in particular be useful in order to reduce the wear of the burls B and/or the substrate W.

It is remarked that in alternative embodiments of the dither device DD having a speaker system, the speaker system may be arranged at any other suitable location. For example, the speaker system may be arranged above the substrate W such that the pressure waves are emitted onto the top side of the substrate in order to vibrate the substrate W.

The above-described advantages of a reduced friction between a support surface S. in particular burls B and a substrate W by vibrating the support surface S and/or the substrate W may also be obtained by alternative embodiments of a dither device DD. Some of these alternative embodiments will now be described.

Figure 3:
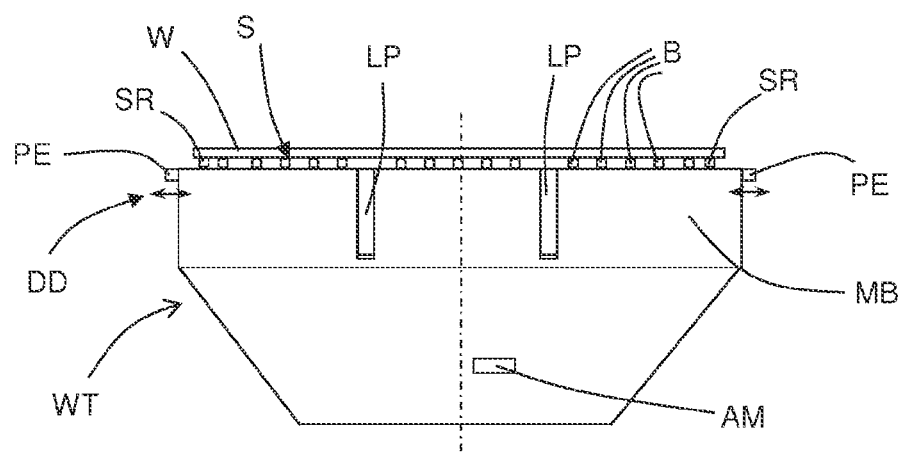
FIG. 3 shows a second embodiment of a substrate support according to an embodiment of the invention.

FIG. 3 shows a second embodiment of a dither device DD according to the invention. The dither device DD of this second embodiment is configured to vibrate the body of the substrate support WT, at least partially, in order to obtain a friction reducing effect on the friction between the burls B and the substrate W.

The dither device DD of the embodiment of FIG. 3 comprises multiple piezo elements PE that are configured to exert a vibrating force on the main body MB of the substrate support WT in a direction substantially parallel to the support surface S, as indicated by double headed arrows in FIG. 3. The resulting vibration of the main body MB will have the desired friction reducing effect on the contacts between the burls B and the substrate W. The piezo elements PE are driven by the amplifier AM in a suitable excitation frequency and with a suitable excitation amplitude to effectively reduce the friction between the burls B and the substrate W.

Figure 4:
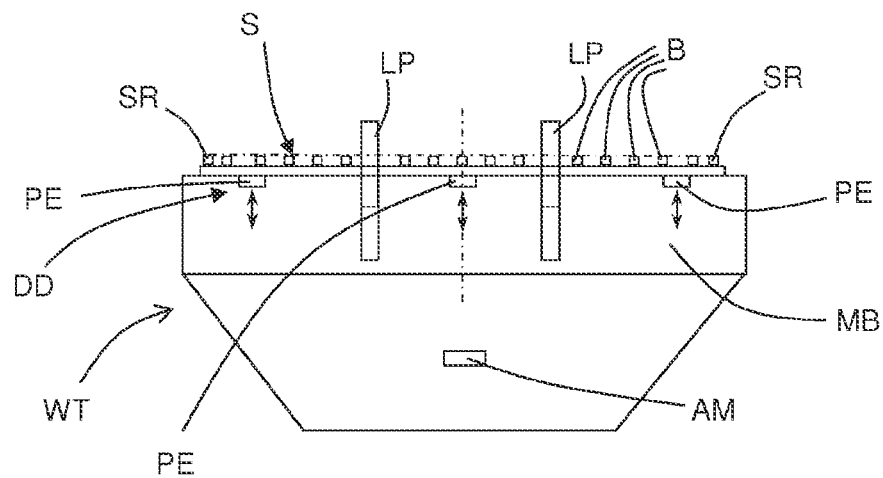
FIG. 4 shows a third embodiment of a substrate support according to an embodiment of the invention.

FIG. 4 shows a third embodiment, in which, similar to the second embodiment of FIG. 3, piezo elements PE are used in order to at least partially vibrate the main body MB of the substrate support WT in order to vibrate the burls B with respect to the substrate W.

The main difference with the embodiment of FIG. 3 is that in the embodiment of FIG. 4 the direction of excitation of the main body MB is in a direction substantially perpendicular to the support surface S as indicated by double headed arrows in FIG. 4. Vibrations of the main body MB in a direction substantially perpendicular to the support surface S will also have a friction reducing effect on the contacts between the substrate W and the burls B.

The amplifier AM is provided to drive the piezo elements PE, in particular during loading and unloading of the substrate W, with a suitable excitation frequency and excitation amplitude to obtain the desired friction reducing effect between the substrate W and the burls B.

It is remarked that in the embodiments of FIGS. 3 and 4 any other type of actuator that is suitable to vibrate the main body MB, at least partially, with a suitable frequency and amplitude may also be applied. In particular, actuators configured to move the substrate support WT with respect to a reference object may be used to vibrate the main body MB at least partially to obtain a friction reducing effect These actuators to move the substrate support WT may for instance be a long-stroke actuator of a long-stroke module or a short-stroke actuator of a short-stroke module, as described with respect to FIG. 1, or any other actuator configured to move the substrate support.

Furthermore, it is remarked that actuators, for example piezo actuators may be used to exert vibrating forces on the main body MB in both a direction parallel to the support surface S and a direction perpendicular to the support surface S may be used or any other suitable direction, or combination of directions.

Figure 5:
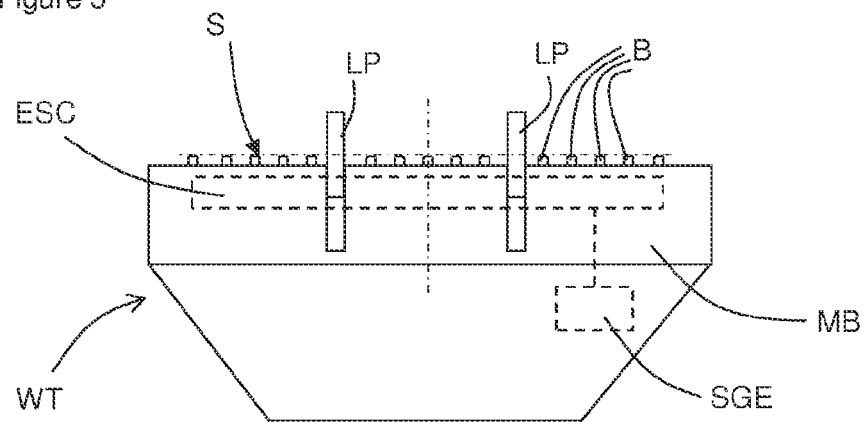
FIG. 5 shows a fourth embodiment of a substrate support according to an embodiment of the invention.

FIG. 5 shows a fourth embodiment of a dither device DD according to the invention. In this embodiment, instead of a vacuum clamping system, an electrostatic clamp ESC is provided to clamp the substrate W with an electrostatic clamping force on the support surface S. It is remarked that in this embodiment, the sealing ring SR is not present, as no vacuum space VS has to be created for a vacuum clamping system.

The electrostatic clamp ESC is driven by an electrostatic clamping signal provided by the signal generator SGE. In order to obtain the friction reducing effect, the signal generator SGE is configured to, during loading and/or unloading of a substrate W on/from the substrate support WT, superimpose a varying vibration signal on the normal electrostatic clamping signal to apply a varying clamping force on the substrate W. The dither device DD may comprise the signal generator SGE, so the dither device DD may be arranged to generate the varying vibration signal. The electrostatic clamp ESC provides the electrostatic force based on the varying vibration signal.

This varying clamping force not only clamps the substrate W on the support surface S, but also creates a vibration of the substrate W with respect to the burls B on which the substrate W is clamped in order to obtain the desired friction reducing effect during loading and/or unloading of a substrate W.

Figure 6:
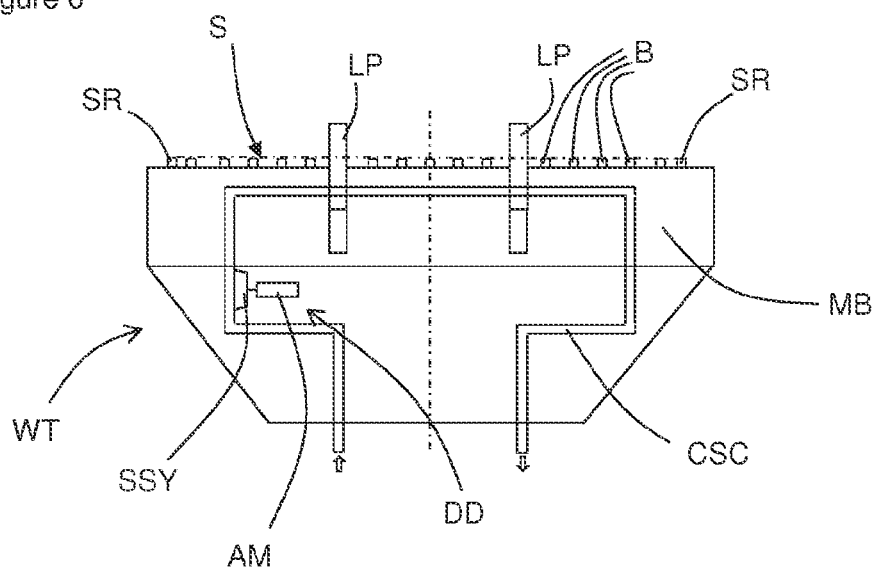
FIG. 6 shows a fifth embodiment of a substrate support according to an embodiment of the invention.

FIG. 6 shows a fifth embodiment of a dither device DD according to the invention. In the embodiment of FIG. 6. the dither device DD comprises a speaker system SSY which is used to create pressure waves. The speaker system SSY is arranged to create pressure waves in cooling fluid that runs through a cooling system circuit CSC in the main body MB of the substrate support WT. In an embodiment, instead of a cooling system circuit CSC, a thermal conditioning system is used. The thermal conditioning system may be arranged to condition a temperature of the substrate support WT by cooling, heating or both cooling and heating. The thermal conditioning system may have a circuit containing a fluid. The speaker system SSY may be arranged to create pressure waves in the fluid in the circuit.

The dither device DD comprises an amplifier AM to drive the speaker system SSY with a desired excitation frequency and excitation amplitude. The pressure waves are propagated in the cooling fluid and used to vibrate the main body MB such that at least the burls B are also vibrated as a result of these pressure waves. This vibration of the burls B creates a friction reducing effect as described above.

In the embodiments described above, the loading pins LP are arranged on the main body MB. Alternatively, the main body MB is provided with through holes. The loading pins LP may extend through the through holes. The loading pins LP may be arranged on another body than the main body.

In an embodiment, the substrate support WT is for supporting the substrate W. The substrate support WT comprises the main body MB, a clamping device and the dither device DD. The main body MB comprises the support surface S for supporting the substrate W. The clamping device is arranged to provide the clamping force to clamp the substrate W on the support surface S. The dither device DD is configured to dither the clamping force. The dither device DD may be configured to dither the clamping force while the substrate W is being loaded onto the support surface S.

The clamping device may comprise the vacuum clamp system. The clamping force may comprise the vacuum force provided by the vacuum clamp system. The dither device DD is arranged to dither the vacuum force. The vacuum clamp may comprise the vacuum conduit VC for conveying a flow from the support surface S to the vacuum source VSO. The dither device DD may be arranged to alter a cross-section of the vacuum conduit VC. The dither device DD may comprise a piezo element.

The clamping device may comprise the electrostatic clamp ESC. The clamping force may comprise the electrostatic force provided by the electrostatic clamp ESC. The dither device DD may be arranged to dither the electrostatic force. The dither device DD may be arranged to generate a signal, such as the varying vibration signal. The electrostatic clamp ESC may provide the electrostatic force based on the signal.

The dither device DD may be configured to dither the clamping force during a period in which the clamping force increases from zero to a maximum clamping force. The dither device DD may be configured to dither the clamping force during a period in which the clamping force decreases from a maximum clamping force to zero. The support surface S may be formed by a plurality of burls arranged on the main body MB. The dither device DD may be configured to dither the clamping force at an excitation frequency between 1 kHz and 1 Mhz.

In an embodiment, there is provided a lithographic apparatus comprising the substrate support WT of one of the embodiments described above, the illumination system IL, the support MT and the projection system PS. The illumination system IL is configured to condition the radiation beam. The support MT is constructed to support the patterning device MA. The patterning device MA is capable of imparting the radiation beam with a pattern in its cross-section to form a patterned radiation beam. The projection system PS is configured to project the patterned radiation beam onto a target portion C of the substrate W.

The lithographic apparatus may comprise a handing device. The handling device is arranged for loading the substrate W onto the support surface S and/or arranged for unloading the substrate W from the support surface S. The dither device DD is arranged to dither the clamping force while the substrate W is partly supported by the handling device and partly supported by the support surface S. The handling device may comprise the loading pins LP. The handling device may comprise the loading device, e.g., the loading robot. The handling device may handle the substrate W by contacting the bottom side of the substrate W or the top side of the substrate W. For example, the handling device comprises a Bernoulli gripper to support the substrate W from the top side of the substrate W. The Bernoulli gripper may provide a vacuum force to clamp the substrate W onto the handling device. The Bernoulli gripper may provide a gas film between the handling device and the substrate W to prevent physical contact between the handling device and the substrate W.

In an embodiment there is provided a loading method, comprising the steps of: i) transferring the substrate W from the handling device onto the support surface S; ii) providing the clamping force to clamp the substrate W on the support surfaces; iii) dithering the clamping force while partly supporting the substrate W with the handling device and partly supporting the substrate W with the support surface S. The loading method may further comprise dithering the clamping force while the clamping force increases from zero to a maximum clamping force.

Figure 7:
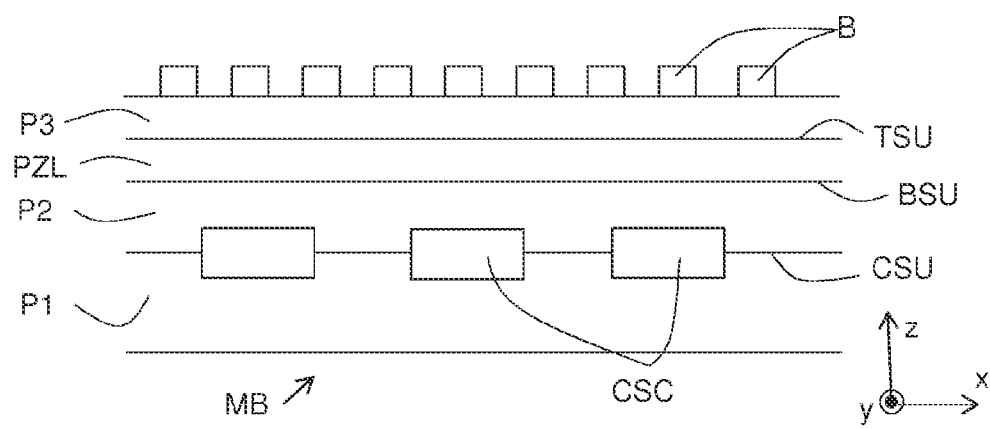
FIG. 7 shows a sixth embodiment of a substrate support according to an embodiment of the invention.

A further embodiment is shown in FIG. 7. FIG. 7 shows a part of a cross-section of the main body MB. The main body MB comprises a first part P1. a second part P2 and a third part P3. The burls B are arranged on the top surface of the third part P3. The first part P1 and the second part P2 are connected to each other via contact surface CSU. A piezolayer PZL is arranged between the second part P2 and the third part P3. A bottom surface BSU of the piezolayer PZL is connected to the second part P2. A top surface TSU of the piezolayer PZL is connected to the third part P3.

The piezolayer PZL has piezo electric material that deforms when an electrical charge is applied to the piezo electric material. The piezolayer PZL may be arranged to deform along the z-axis when the electrical charge is applied. For example, the thickness of the piezolayer PZL may be altered by applying different electrical charges. The piezolayer PZL may be arranged to deform along x-axis. In this case, the piezolayer PZL forms a shear-piezo, in which the top surface TSU moves relative to the bottom surface BSU along the x-direction. The piezolayer PZL may form a shear-piezo in which the top surface TSU moves relative to the bottom surface BSU along a direction in the xy-plane.

When an electrical charge is applied to the piezolayer PZL, the top surface TSU is moved relative to the bottom surface BSU. As a result, the third part P3 is moved relative to the second part P2. A movement of the third part P3 causes the burls B to move.

An electrical charge may be applied that varies over time to cause the burls B to vibrate. For example, the electrical charge may be applied as a sine-shaped function over time. The electrical charge may be applied as a series of step-functions in which the electrical charge varies over a plurality of values. The piezolayer PZL may move the burls B at a high frequency, for example with a frequency of 500 Hz-5000 Hz. The amplitude of the movement may be small, for example in the range of 10 nm-100 nm. The movement may be referred to as dither. The piezolayer PZL may be considered a dither device DD. The dither may be along the z-direction, along the xy-plane or in a combination thereof.

When a substrate W is being loaded on the burls B, the piezolayer PZL may dither the burls B. When the substrate W contacts the burls B, the dither causes the friction between the substrate W and the burls B to reduced compared to a friction without dither. As a result, the substrate W may slide more easily over the burls B and the substrate W may be loaded with less internal stress. Dither may be applied after loading the substrate W onto the burls B, when the substrate W is fully supported by the burls B. Dither may be applied during unload of the substrate W from the burls B. The dither may reduce the friction between the substrate W and the burls B during unload which may help to reduce wear of the burls B.

The piezolayer PZL may be actuated by the electrical charge to cause the burls B to vibrate as a standing wave. As the burls B vibrate as a standing wave, internal stress of the substrate W may be removed or reduced. Alternatively, the piezolayer PZL may be actuated by the electrical charge to cause the burls B to vibrate as a travelling wave.

The piezolayer PZL may form an integrated part of the main body MB. The piezolayer PZL may be connected to the second pan P2 and the third part P3 via bonding or via deposition or a combination thereof. Bonding may take place in a fire process. The burls B may be created and polished after the piezolayer PZL is connected to the second part P2 and the third part P3 to acquire a desired flatness of the burls B.

The piezolayer PZL is provided with electrodes to apply the electrical charge to the piezo electric material. The layout of the electrodes depends on the desired deformation of the piezolayer PZL. A pattern of the electrodes may be made using a lithographic process. Further, the piezolayer PZL may be applied as a continuous layer. Alternative, the piezolayer PZL may be applied as a layer with a plurality of portions. For example, the portions are arranged as concentric rings or as wedges. The portions may each be provided with a dedicated electrical charge, or the portions may be provided with a common electrical charge. The piezolayer PZL may have openings, for example to provide space for the loading pins LP.

In FIG. 7, the piezolayer PZL is provided between the second part P2 and the third part P3. Alternatively, the piezolayer PZL is provide at the contact surface CSU.

between the first part P1 and the second part P2. Alternatively, the piezolayer PZL is provided in or below the first part P1. In an embodiment, multiple piezolayers PZL are provided.

In an embodiment, there is provided a substrate support for supporting a substrate, the substrate support comprising: a body; a clamping device; and a dither device; wherein the body comprises a support surface for supporting the substrate, wherein the clamping device is arranged to provide a clamping force to clamp the substrate on the support surface, and wherein the dither device is configured to dither the clamping force.

In an embodiment, the dither device is configured to dither the clamping force while the substrate is being loaded onto the support surface. In an embodiment, the clamping device comprises a vacuum clamp system, wherein the clamping force comprises a vacuum force provided by the vacuum clamp system, wherein the dither device is arranged to dither the vacuum force. In an embodiment, the vacuum clamp comprises a vacuum conduit for conveying a flow from the support surface to a vacuum source, wherein the dither device is arranged to alter a cross-section of the vacuum conduit. In an embodiment, the dither device comprises a piezo element. In an embodiment, the clamping device comprises an electrostatic clamp, wherein the clamping force comprises an electrostatic clamping force provided by the electrostatic clamp, wherein the dither device is arranged to dither the electrostatic clamping force. In an embodiment, the dither device is arranged to generate a signal, wherein the electrostatic clamp provides the electrostatic clamping force based on the signal. In an embodiment, the dither device is configured to dither the clamping force during a period in which the clamping force increases from zero to a maximum clamping force. In an embodiment, the dither device is configured to dither the clamping force during a period in which the clamping force decreases from a maximum clamping force to zero. In an embodiment, the support surface is formed by a plurality of burls arranged on the body. In an embodiment, the dither device is configured to dither the clamping force at an excitation frequency between 1 kHz and 1 MHz.

In an embodiment, there is provided a lithographic apparatus comprising: a substrate support as described herein; an illumination system configured to condition a radiation beam; a support constructed to support a patterning device, the patterning device being capable of imparting the radiation beam with a pattern in its cross-section to form a patterned radiation beam; and a projection system configured to project the patterned radiation beam onto a target portion of the substrate.

In an embodiment, the lithographic apparatus comprises a handling device, wherein the handling device is arranged for loading the substrate onto the support surface and/or arranged for unloading the substrate from the support surface, and wherein the dither device is arranged to dither the clamping force while the substrate is partly supported by the handling device and partly supported by the support surface.

In an embodiment, there is provided a loading method, comprising: transferring a substrate from a handling device onto a support surface, providing a clamping force to clamp the substrate on the support surface, and dithering the clamping force while partly supporting the substrate with the handling device and partly supporting the substrate with the support surface.

In an embodiment, the loading method comprises dithering the clamping force while the clamping force increases from zero to a maximum clamping force.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

While specific embodiments of the invention have been described above, it will be appreciated that the invention may be practiced otherwise than as described The descriptions above are intended to be illustrative, not limiting. Thus, it will be apparent to one skilled in the art that modifications may be made to the invention as described without departing from the scope of the claims set out below.

What is claimed is:

1. A substrate support comprising:
a body comprising a support surface to support a substrate;
a clamp system configured to provide a clamping force to clamp the substrate on the support surface, the clamp system comprising a conduit to convey a flow of fluid from the support surface to an underpressure source; and
a dither device configured to dither the clamping force of the substrate, wherein the dither device is configured to alter a cross-section of the conduit.

2. The substrate support of claim 1, wherein the dither device is configured to apply pressure waves.

3. The substrate support of claim 1, further comprising a handling device arranged to load the substrate onto the support surface and/or unload the substrate from the support surface.

4. The substrate support of claim 3, wherein the dither device is configured to dither the clamping force while the substrate is partly supported by the handling device.

5. The substrate support of claim 3, wherein the handling device comprises a loading pin, the loading pin arranged to have an upper end arranged below the support surface when in a retracted position and arranged to have the upper end extend above the support surface when in an extended position.

6. The substrate support of claim 1, wherein the dither device is configured to dither the clamping force during a period in which the clamping force increases toward a maximum clamping force.

7. The substrate support of claim 1, wherein the dither device is configured to dither the substrate at an excitation frequency between 1 kHz and 1 MHz.

8. The substrate support of claim 1, wherein the dither device comprises a piezo element.

9. The substrate support of claim 1, wherein the support surface is defined by a plurality of burls arranged on the body.

10. A lithographic apparatus comprising:
the substrate support of claim 1; and
a projection system configured to transfer a radiation beam toward the substrate support.

11. A substrate support comprising:
a body comprising a support surface to support a substrate;
a clamp system configured to provide a clamping force to clamp the substrate on the support surface, the clamp system comprising a conduit to convey a flow of fluid from the support surface to an underpressure source; and
a dither device configured to dither the substrate, wherein the dither device is configured to configured to apply pressure waves and configured to generate the pressure waves in a conduit of the clamp system and/or in fluid that runs through a cooling system circuit or a thermal conditioning system.

12. The substrate support of claim 11, wherein the dither device comprises a speaker system configured to create the pressure waves.

13. The substrate support of claim 12, wherein the speaker system is arranged in a conduit of the clamp system.

14. The substrate support of claim 11, wherein the dither device is configured to dither the substrate at an excitation frequency between 1 kHz and 1 MHz.

15. The substrate support of claim 11, wherein the dither device is configured to dither the substrate during a period in which the clamping force increases toward a maximum clamping force.

16. The substrate support of claim 11, further comprising a handling device arranged to load the substrate onto the support surface and/or unload the substrate from the support surface.

17. The substrate support of claim 16, wherein the dither device is configured to dither the substrate while the substrate is partly supported by the handling device.

18. The substrate support of claim 16, wherein the handling device comprises a loading pin, the loading pin arranged to have an upper end arranged below the support surface when in a retracted position and arranged to have the upper end extend above the support surface when in an extended position.

19. The substrate support of claim 11, further comprising a gas injection system configured to supply gas into the conduit.

20. A lithographic apparatus comprising:
the substrate support of claim 11; and
a projection system configured to transfer a radiation beam toward the substrate support.

* * * * *